United States Patent
Zhao et al.

(10) Patent No.: US 9,165,668 B1
(45) Date of Patent: Oct. 20, 2015

(54) DATA RETENTION MONITORING USING TEMPERATURE HISTORY IN SOLID STATE DRIVES

(71) Applicant: Western Digital Technologies, Inc., Irvine, CA (US)

(72) Inventors: Dengtao Zhao, Santa Clara, CA (US); Yongke Sun, Pleasanton, CA (US); Haibo Li, Sunnyvale, CA (US); Kroum S. Stoev, Pleasanton, CA (US); Mei-Man L. Syu, Fremont, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 14/026,017

(22) Filed: Sep. 13, 2013

Related U.S. Application Data (60) Provisional application No. 61/859,714, filed on Jul. 29, 2013.

(51) Int. Cl.
    G11C 7/04     (2006.01)
    G11C 16/34    (2006.01)
    G06F 11/30    (2006.01)

(52) U.S. Cl.
    CPC ........ G11C 16/3418 (2013.01); *G06F 11/3058* (2013.01); *G06F 2212/7207* (2013.01); *G11C 16/3495* (2013.01)

(58) Field of Classification Search
    CPC ................. G11C 16/3418; G11C 16/3495
    USPC ...................... 365/211, 222, 185.24
    See application file for complete search history.

(56) References Cited

U.S. PATENT DOCUMENTS

| | | | |
|---|---|---|---|
| 6,639,937 B2 * | 10/2003 | Doetsch et al. ............... | 375/130 |
| 6,940,775 B2 * | 9/2005 | Schneider et al. ............ | 365/222 |
| 7,248,527 B2 * | 7/2007 | Park .............................. | 365/222 |
| 7,460,394 B2 * | 12/2008 | Happ et al. ..................... | 365/163 |
| 7,493,531 B2 * | 2/2009 | Ito et al. ........................ | 714/708 |
| 7,539,050 B2 * | 5/2009 | Philipp et al. ................. | 365/163 |
| 7,623,401 B2 * | 11/2009 | Philipp et al. ................. | 365/222 |
| 7,817,469 B2 | 10/2010 | Avraham et al. | |
| 7,843,753 B2 * | 11/2010 | Mayer et al. ................... | 365/222 |
| 8,111,575 B2 * | 2/2012 | Mori et al. ..................... | 365/222 |
| 8,279,696 B2 * | 10/2012 | Shinozaki ...................... | 365/206 |
| 8,300,488 B2 * | 10/2012 | Pyeon ............................ | 365/222 |
| 8,395,323 B2 | 3/2013 | Wendt et al. | |
| 8,719,531 B2 * | 5/2014 | Strange et al. ................ | 711/165 |
| 8,737,136 B2 * | 5/2014 | Cometti ................... | 365/185.22 |
| 8,982,653 B2 * | 3/2015 | Nurminen et al. ............ | 365/211 |
| 8,995,218 B2 * | 3/2015 | Koyama ........................ | 365/227 |

(Continued)

*Primary Examiner* — Viet Q Nguyen
(74) *Attorney, Agent, or Firm* — Shumaker & Sieffert, P.A.

(57) ABSTRACT

Systems and methods for data retention manager in a solid state storage system utilizing temperature measurement mechanisms are disclosed. Background data scanning can provide an efficient way to monitor data health and can be used to determine whether data refreshing is needed or to prevent data retention from degrading beyond error correction capabilities. In certain embodiments, data scanning may be performed as a background process regularly, for example, every month. However, effects of temperature on data retention may not be adequately accounted for using such methods. Certain embodiments disclosed herein provide a numerical integral method for taking account the system temperature by using the acceleration factor for data retention. Embodiments disclosed herein may provide for accurate handling of data retention in view of complex device temperature history.

24 Claims, 4 Drawing Sheets

(56) References Cited

U.S. PATENT DOCUMENTS

| | | |
|---|---|---|
| 2011/0219203 A1 | 9/2011 | Nurminen et al. |
| 2011/0302353 A1 | 12/2011 | Confalonieri et al. |
| 2012/0101731 A1 | 4/2012 | Joseph |
| 2012/0287711 A1 | 11/2012 | Kim et al. |
| 2012/0324191 A1 | 12/2012 | Strange et al. |
| 2014/0101371 A1* | 4/2014 | Nguyen et al. ............ 711/103 |
| 2014/0229131 A1* | 8/2014 | Cohen et al. ............... 702/64 |
| 2014/0254298 A1* | 9/2014 | Dally ...................... 365/222 |

* cited by examiner

DATA RETENTION MONITORING USING TEMPERATURE HISTORY IN SOLID STATE DRIVES

CROSS-REFERENCE TO RELATED APPLICATIONS

This application claims priority to provisional U.S. Patent Application Ser. No. 61/859,714, filed on Jul. 29, 2013, which I hereby incorporated by reference in its entirety.

BACKGROUND

1. Technical Field

This disclosure relates to computing systems. More particularly, the disclosure relates to systems and methods for managing data retention in a data storage system.

2. Description of the Related Art

Solid-state memory may utilize transistor devices to store charge representing data. Over time, such transistor devices can lose charge, causing data retention issues. Data retention in solid-state storage devices can depend of various environmental conditions, such as temperature.

BRIEF DESCRIPTION OF THE DRAWINGS

Various embodiments are depicted in the accompanying drawings for illustrative purposes, and should in no way be interpreted as limiting the scope of this disclosure. In addition, various features of different disclosed embodiments can be combined to form additional embodiments, which are part of this disclosure.

DETAILED DESCRIPTION

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

TERMINOLOGY

The term "equivalent," as used to describe equivalent data retention time, may refer to an effective data retention state of a cell, block, die, or other portion of solid-state memory. Therefore, equivalent data retention time may take into consideration both the temperature experienced by the memory, as well as the time the data has been written to memory.

As used in this application, "non-volatile solid-state memory," "non-volatile memory," "NVM," or variations thereof may refer to solid-state memory such as NAND flash. However, the systems and methods of this disclosure may also be useful in more conventional hard drives and hybrid drives including both solid-state and hard drive components. Solid-state memory may comprise a wide variety of technologies, such as flash integrated circuits, Phase Change Memory (PC-RAM or PRAM), Programmable Metallization Cell RAM (PMC-RAM or PMCm), Ovonic Unified Memory (OUM), Resistance RAM (RRAM), NAND memory, NOR memory, EEPROM, Ferroelectric Memory (FeRAM), MRAM, or other discrete NVM (non-volatile solid-state memory) chips. The non-volatile solid-state memory arrays or storage devices may be physically divided into planes, blocks, pages, and sectors, as is known in the art. Other forms of storage (e.g., battery backed-up volatile DRAM or SRAM devices, magnetic disk drives, etc.) may additionally or alternatively be used.

Overview

Figure 1:
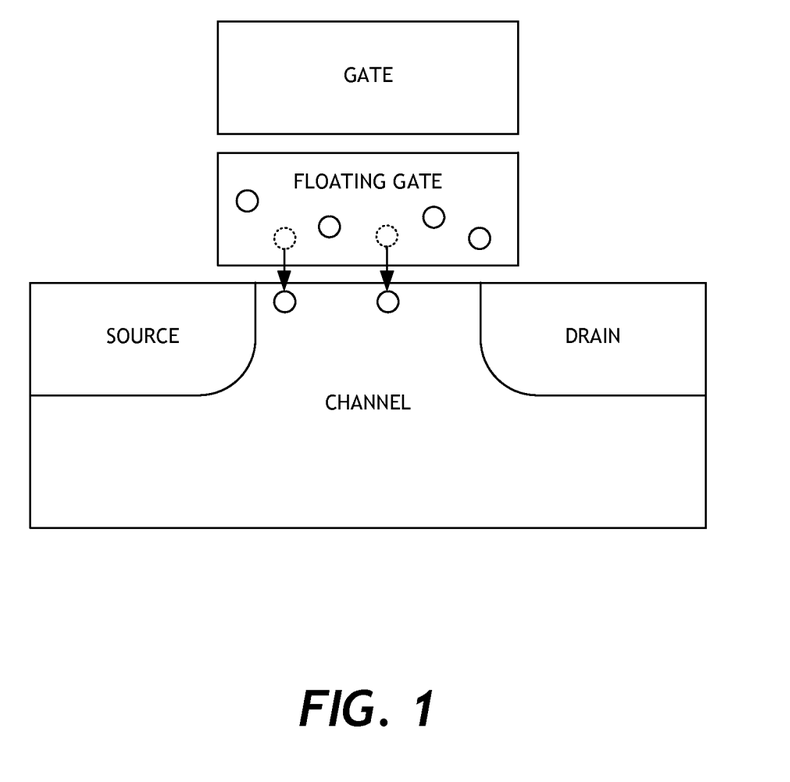
FIG. 1 is a cross-sectional view of an embodiment of a floating-gate transistor.

Floating-gate transistors can be used as charge-storing devices for maintaining data in a solid-state storage system. FIG. 1 is a cross-sectional view of an embodiment of a floating-gate transistor. Floating-gate transistors may comprise an insulating oxide layer disposed between a "floating" gate and a semiconductor substrate. In certain embodiments, writing to the transistor cell can be performed by forcing electrons through the oxide layer by applying a high enough voltage to the gate. To erase a cell, the substrate well may be raised to a high enough voltage to force the electrons back through the oxide layer from the floating gate into the channelsubstrate. The cell may be read by applying a threshold voltage to the gate and sensing the current flowing in the transistor.

The repeated electron tunneling mechanism from writing and erasing the transistor cell can cause the buildup of charge traps in the tunnel oxide layer, which can affect the cell's ability to store charge. De-trapping of charges can cause the cell threshold to decrease from the level set through the relevant program algorithm, leading to a potential "bit flip." Various factors may affect the effect of charge de-trapping on data retention, such as, for example, time and temperature.

Because charge de-trapping can cause the charges stored in solid-state memory cells to degrade, it may be desirable to implement data refreshing/scrubbing in solid state drive applications in order to refresh stored data (e.g., to other unused blocks) before the data retention degrades to the extent that data cannot be correctly read out. One method for determining when data scrubbing should be performed involves performing a data integrity scan (DIS). Such scans may be performed periodically, such as on at monthly, weekly, or other intervals. In certain embodiments, data integrity scans determine whether data scrubbing is needed based at least in part on calculated row bit error rate. Data scrubbing determinations according to such methods may be based on duration of time since programming.

In addition to storage time, as referenced above, additional environmental factors may contribute to a solid-state drive's data retention characteristics. For example, temperature can adversely affect data retention characteristics, particularly with respect to heavily cycled blocks. In certain implementations, the temperature that a drive is subjected to during power-off periods is not taken into consideration when determining when blocks of data should be refreshed.

The ability of solid-state memory, such as NAND flash, to store and retain data can depends on the temperature that the memory is subjected to during writing, as well as between the time the data is written to the time the data is read. According to Arrhenius' equation, data retention acceleration caused by elevated temperatures is an exponential function, and therefore its effect can be significant.

Thermal activated acceleration can be used for data retention testing of solid-state drives, where an escalated temperature is used to accelerate data retention effects so that a full data retention test can be completed in a shortened period of time. The term "acceleration factor" (AF), or "data retention AF," which may be used in the context of such testing, refers to the degree to which a relatively elevated temperature accelerates the degradation of solid-state cells. As described herein, an elevated temperature can greatly accelerate the de-trapping process in the context of data retention; AF can be an exponential function with respect to the relationship between temperature and activation energy. Certain embodiments disclosed herein provide improved estimation of equivalent data retention time after data is programmed to a block of solid-state memory. Certain embodiments involve equivalent data retention time calculation based at least in part on calculated or determined acceleration factor values for various sampled temperature points.

Certain embodiments disclosed herein provide a solid-state storage device comprising a non-volatile solid-state memory array including a plurality of non-volatile memory devices configured to store data and a temperature sensor. The solid-state storage device may further include a controller configured to write user data to the non-volatile solid-state memory array at a first time and receive a signal from the temperature indicating a temperature of at least a portion of the non-volatile memory array. In certain embodiments, the controller is further configured to calculate or determine an acceleration factor value based at least in part on the temperature signal and calculate or determine an accumulated effective data retention time period relative to a reference temperature. The controller may be further configured to determine whether the effective data retention time period exceeds a predetermined threshold value and cause a data scrubbing operation to be executed when it is determined that the predetermined threshold value was exceeded.

Data Storage System

Figure 2:
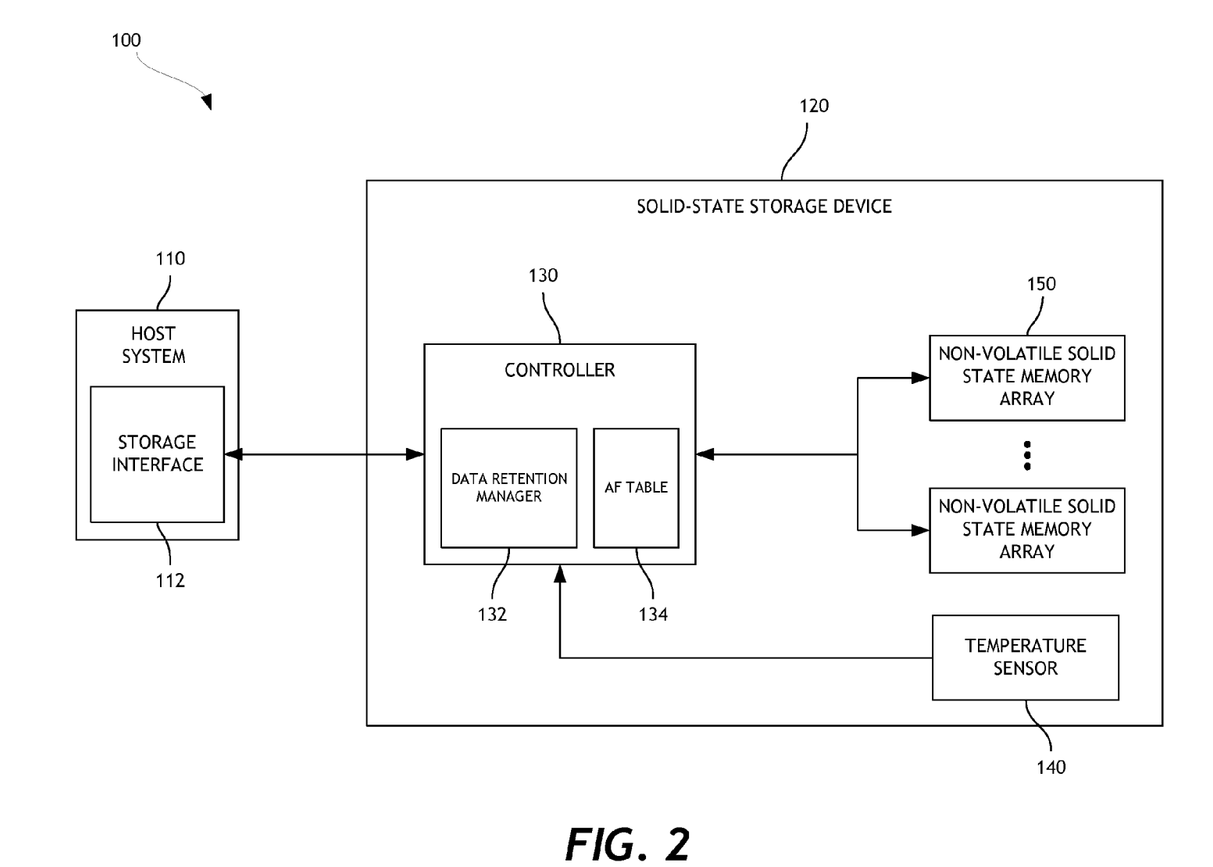
FIG. 2 is a block diagram illustrating an embodiment of a data storage system.

FIG. 1 is a block diagram illustrating an embodiment of a combination of a host system 110 with a solid-state storage device 120 incorporating data retention management functionality for determining when to refresh blocks of data stored in one or more solid-state memory arrays 150. As shown, the solid-state storage device 120 (e.g., hybrid hard drive, solid-state drive, any storage device utilizing solid-state memory, etc.) includes a controller 130, which in turn includes a data retention manager module 132. In certain embodiments, the data retention manager module 132 is configured to receive signals from one or more temperature sensors 140 indicating a temperature of the non-volatile solid-state memory array(s), or a portion thereof. The controller 130 can further include internal memory for storing system data, which may be of one or more suitable memory types, such as, for example, DRAM. For example, the controller may maintain one or more tables 134 or data structures including acceleration factor (AF) data associated with the memory array(s). The AF table data entries may be calculated by the controller 130 (e.g., the data retention manager 132), or pre-calculated and looked-up by the controller 130, based on information received from the temperature sensor(s) 140. In certain embodiments, AF table data 134 is maintained in the non-volatile memory array(s) 150. In some embodiments, the controller 130 is configured to perform the data retention management functions as further described below.

In certain embodiments, the controller 130 is configured to receive memory access commands from a storage interface (e.g., a device driver) 112 residing on a host system 110. The controller 130 is configured to execute commands in response to such host-issued memory commands in the non-volatile solid-state memory arrays 150. Storage access commands communicated by the storage interface 112 can include write and read commands issued by the host system 110. The commands can specify a block address in the data storage system 120, and the controller 130 can execute the received commands in the non-volatile solid-state memory array(s) 150. Data may be accessed/transferred based on such commands.

The solid-state storage device 120 can store data received from the host system 110 such that the solid-state storage device 120 acts as memory storage for the host system 110. To facilitate this function, the controller 130 can implement a logical interface. The logical interface can present to the host system 110 storage system memory as a set of logical addresses (e.g., contiguous addresses) where data can be stored. Internally, the controller 130 can map logical addresses to various physical memory addresses in the non-volatile solid-state memory array 150 and/or other memory module(s). Mapping data indicating the mapping of logical addresses to physical memory addresses may be maintained in the solid-state storage device.

In an embodiment, the storage device 120 may be a hybrid disk drive that additionally includes magnetic memory storage (not shown). In such case, one or more controllers 130 may control the magnetic memory storage and the non-volatile solid-state memory array(s) 150.

Acceleration Factor Calculation

In certain embodiments, data retention in solid-state devices, such as NAND flash, involves a typical charge thermal activated de-trapping process, which, as described above, can be significantly affected by temperature. For purposes of discussion, the time-to-fail $\tau$ of a portion of solid-state memory can be expressed as:

$$\tau = \tau_o \exp\left(\frac{E_a}{K_B T}\right) \quad (1)$$

where $\tau_o$ is a reference constant, $E_a$ is the activation energy which is a measure of the difficulty of charge de-trapping (As used herein, $E_a$=1.1 eV for NAND flash working with F-N tunneling for program and erase), $K_B$ is the Boltzmann constant, and T is the temperature to which the device is exposed. As demonstrated by equation (1), as the value of T increases, the time-to-fail may decrease. The acceleration factor $$\left(AF = \frac{\tau_1}{\tau_2}\right)$$

when T is increased from $T_1$ to $T_2$ can be calculated as:

$$AF = \frac{\exp\left(\frac{E_a}{K_B T_1}\right)}{\exp\left(\frac{E_a}{K_B T_2}\right)} = \exp\left\{\frac{E_a}{K_B}\left(\frac{1}{T_1} - \frac{1}{T_2}\right)\right\} \quad (2)$$

As is apparent from equation (2), when $T_1$ and $T_2$ are known AF may be calculated. For example, the controller 130 of FIG. 2 may be configured to perform AF calculations using temperature readings from the temperature sensor 140 to represent $T_2$, and using a reference temperature, such as 40° C., for $T_1$. Table A below provides an example table of AF data for various temperatures calculated with respect to a 40° C. reference temperature:

TABLE A

| Temperature (C.) | AF Relative to 40° C. |
| --- | --- |
| 25 | 0.13 |
| 30 | 0.26 |
| 35 | 0.52 |
| 40 | 1.00 |
| 45 | 1.90 |
| 50 | 3.5 |
| 55 | 6.5 |
| 60 | 11.6 |
| 65 | 20.4 |
| 70 | 35 |
| 75 | 60 |
| 80 | 101 |
| 85 | 168 |
| 90 | 274 |
| 95 | 441 |
| 100 | 704 |
| 105 | 1104 |
| 110 | 1715 |
| 115 | 2632 |
| 120 | 4000 |
| 125 | 6024 |

As shown, in an embodiment, a temperature of 85° C. may correspond to an AF approximately equal to 168. That is, 1 hour data retention at 85° C. may be equivalent to approximately 168 hours of data retention at 40° C.

Figure 3:
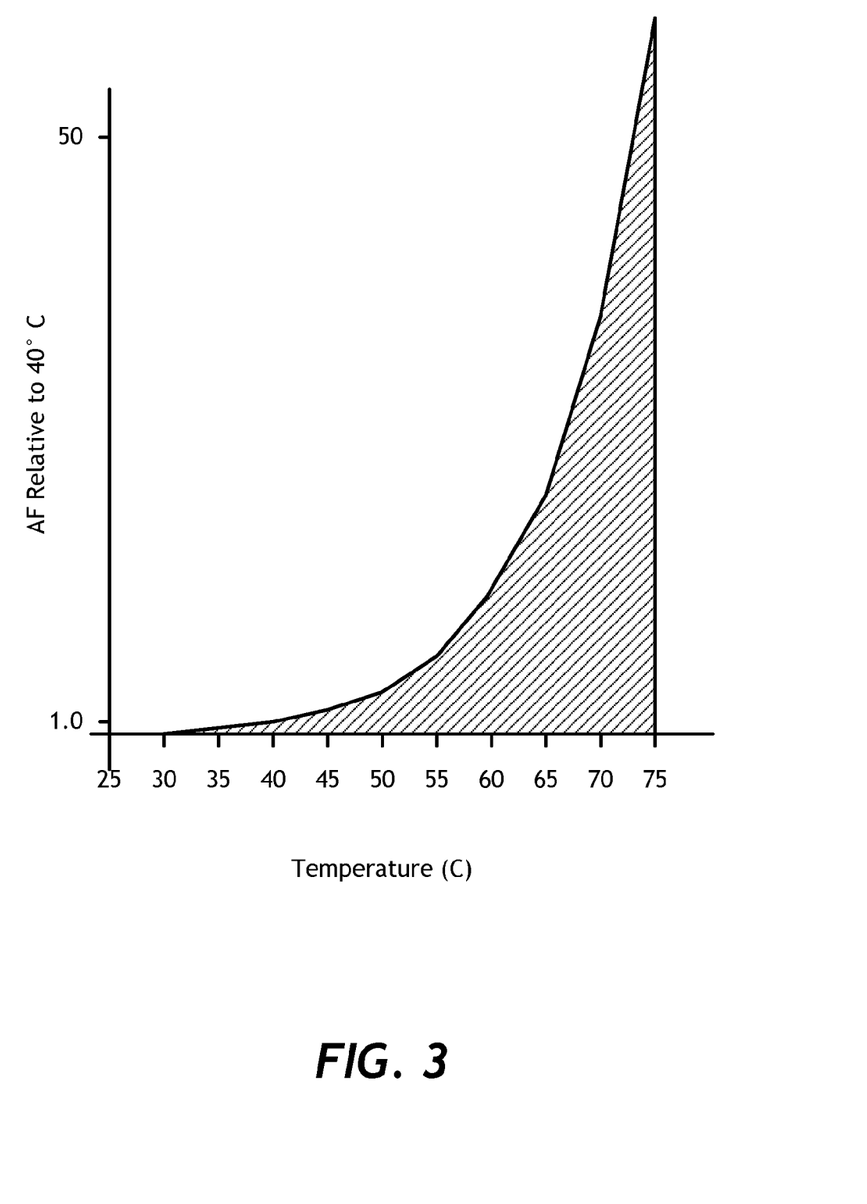
FIG. 3 is a graph representing data retention acceleration factor to temperature relationships according to an embodiment.

FIG. 3 is a graph representing data retention acceleration factor to temperature relationships according to an embodiment. The graph of FIG. 3 shows that as temperature increases, in certain embodiments, data retention acceleration factor may increase in a substantially exponential manner. The curve of FIG. 3 corresponds loosely to the data represented in a Table A above.

Equivalent Data Retention Time Calculation

As described herein, the temperature history of a solid-state drive, or portion thereof, may be expressed as a function of time as T=T(t). Therefore, the total equivalent time from programming to a later reference time (relative to, for example, 40° C.) may be expressed as:

$$t_{effective} = \int_0^t AF(T)dt \quad (3)$$

Additionally, the temperature history may be represented as a discrete numerical integral over the temperature history as:

$$t_{effective} = \Sigma_0^n AF(T)\Delta t \quad (4)$$

The duration of time represented by $\Delta t$ may be any suitable period of time, such as, for example, 1 hour. In certain embodiments, the controller 130 may check temperature every $\Delta t$ interval and calculate or look-up AF values for each measured temperature. Then the equivalent time segment $AF(T)\Delta t$ may be accumulated to the current, or relevant, total effective time. In certain embodiments, such checking and calculation may persist until $t_{effective}$ achieves a pre-set threshold, such as the equivalent of 30 days at 40° C.

Figure 4:
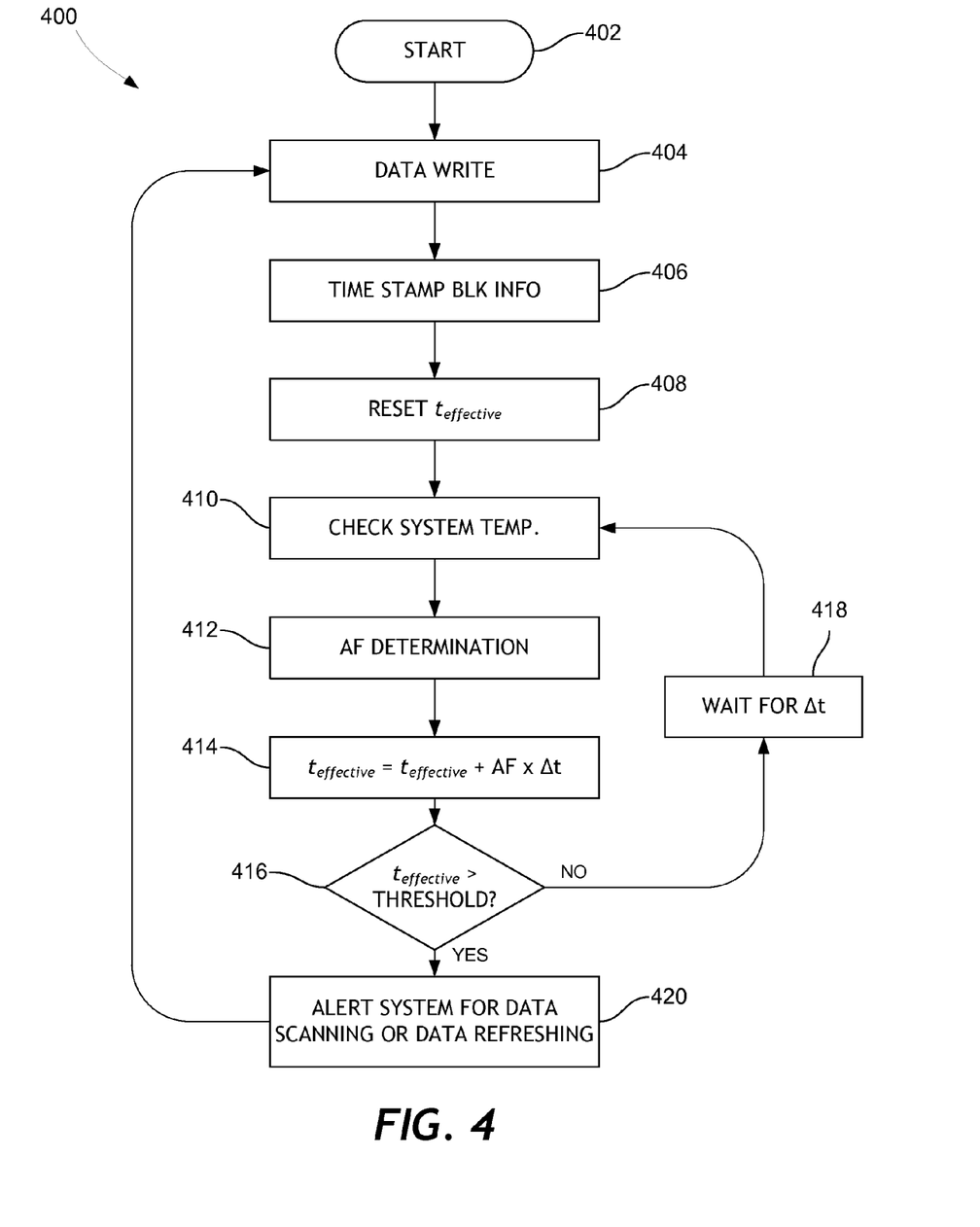
FIG. 4 is a flow chart illustrating a process for managing data retention in a solid-state storage system according to an embodiment.

FIG. 4 is a flow chart illustrating a process 400 for managing data retention in a solid-state storage system according to an embodiment. The process 400 demonstrates how a system may operate with an intelligent data scrubbing or data integrity scan logic. The process 400 starts at block 402 and is directed to block 404, where a data write operation is performed to a solid-state storage array. For example, the data write operation may be associated with a block, page, or other segment of data in the storage array. In certain embodiments, timestamp data associated with the data write may be recorded in the storage array, or at some other location, as shown in block 406.

The process 400 may provide a mechanism for tracking "effective" age of the data written to the solid-state storage array. That is, the process 400 may involve maintaining a calculated or determined value, $t_{effective}$, which represents the equivalent amount of time since the data was written, taking into account the effect of temperature on the data retention characteristics of the memory cells. At block 408, a value for $t_{effective}$ associated with the data write is reset, wherein the value increases over time as data retention of the memory degrades. $t_{effective}$ may correspond to some portion of the solid-state array. For example, the method 400 may track $t_{effective}$ values on a block-level, page-level, or other scheme.

At block 410, the process 400 involves checking system temperature. For example, a storage drive may have one or more temperature sensors disposed in proximity to the solid-state memory array(s), wherein a one or more temperature signals provided by such sensor(s) indicate a temperature of the solid-state memory. Using the system temperature, a data retention acceleration factor (AF) may be calculated or determined at block 412. For example, the AF may be calculated using Equation (2) above. In certain embodiments, discrete AF values are maintained in one or more look-up tables in system memory, wherein AF calculation at block 412 comprises accessing the look-up table and selecting an appropriate AF value based at least in part on the system temperature.

At block 412, $t_{effective}$ is calculated based at least in part on the calculated/determined AF value. For example, $t_{effective}$ may be calculated/determined according to the following equation:

$$t_{effective} = t_{effective} + AF \times \Delta t \quad (5)$$

During a first iteration of process 400, where $t_{effective}$ is being calculated or determined for a first time following reset at block 408 (i.e., $t_{effective}=0$), the calculation of a current value of $t_{effective}$ using Equation (5) is reduced simply to:

$$t_{effective} = AF \times \Delta t \quad (6)$$

where $\Delta t$ corresponds to a period of time over which the solid-state memory is determined or estimated to have experienced the measured temperature. For example, if the process 400 involves checking system temperature periodically, $\Delta t$ may correspond to the period between temperature checks. In an embodiment, $\Delta t$ is approximately one hour. In certain other embodiments, $\Delta t$ may be dependent on system temperature. For example, $\Delta t$ may be shorter for higher temperatures due to the data retention effects of increased temperature. Furthermore, $\Delta t$ may be based at least in part on program/erase (P/E) cycle condition.

After determining $t_{effective}$, the process 400 involves determining whether the value for $t_{effective}$ exceeds a predetermined threshold. If so, the process 400 proceeds to block 420 where the system is alerted for data scanning or data refreshing. When $t_{effective}$ is below the predetermined threshold, the process 400 proceeds to block 418 to wait for the predetermined time interval, $\Delta t$, before checking the temperature again at block 410. In certain embodiments, the pre-set time threshold is a function of P/E cycling (or other equivalent characteristic, such as raw bit error rate RBER). For example, more P/E cycled blocks may receive more frequent scanning; that is, they may correspond to shorter time "thresholds." The process 400 loops between blocks 410 and 416 until $t_{effective}$ exceeds the threshold, at which point data scanning and/or refreshing of the solid-state memory is performed or scheduled.

Other Variations

Those skilled in the art will appreciate that in some embodiments, other types of data storage systems and/or power management can be implemented. In addition, the actual steps taken in the processes discussed herein may differ from those described or shown in the figures. Depending on the embodiment, certain of the steps described above may be removed, others may be added.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A solid-state storage device comprising:
a non-volatile solid-state memory array comprising a plurality of non-volatile memory devices configured to store data;
a temperature sensor; and
a controller configured to:
write user data to the non-volatile solid-state memory array at a first time;
receive a signal from the temperature sensor indicating a temperature of at least a portion of the non-volatile memory array at a second time;
determine a data retention acceleration factor value based at least in part on the temperature signal;
determine an accumulated effective data retention time period relative to a reference temperature based at least in part on the data retention acceleration factor value;
determine whether the effective data retention time period exceeds a predetermined threshold value; and
cause a data refreshing operation to be executed when it is determined that the predetermined threshold value was exceeded.

2. The solid-state storage device of claim 1, wherein the controller is further configured to, when it is determined that the predetermined threshold value was not exceeded:
receive a next signal from the temperature sensor indicating a temperature of the at least a portion of the non-volatile memory array at a third time, the third time being a predetermined period of time after the second time;
determine a next data retention acceleration factor value based at least in part on the next temperature signal;
determine an updated accumulated effective data retention time period relative to the reference temperature based at least in part on the next data retention acceleration factor value;
determine whether the updated effective data retention time period exceeds the predetermined threshold value; and
cause a data refreshing operation to be executed when it is determined that the predetermined threshold value was exceeded.

3. The solid-state storage device of claim 2, wherein the predetermined period of time is approximately one hour.

4. The solid-state storage device of claim 2, wherein the predetermined period of time is at least partially temperature dependent.

5. The solid-state storage device of claim 2, wherein the predetermined period of time is at least partially dependent on a program/erase cycling condition of the solid-state memory array.

6. The solid-state storage device of claim 2, wherein the controller is configured to determine the updated accumulated effective data retention time period by multiplying the next data retention acceleration factor value by the predetermined period of time to produce a value and adding the value to the accumulated effective data retention time period to produce the updated accumulated effective data retention time period.

7. The solid-state storage device of claim 1, wherein the reference temperature is approximately 40° C.

8. The solid-state storage device of claim 1, wherein the controller is further configured to store a timestamp value associated with the first time.

9. The solid-state storage device of claim 1, wherein the controller is further configured to store the accumulated effective data retention time period for use in determining an updated accumulated effective data retention time period at a future time.

10. The solid-state storage device of claim 1, wherein controller is configured to determine the data retention acceleration factor based at least in part on the following equation:

$$AF = \exp\left\{\frac{E_a}{K_B}\left(\frac{1}{T_1} - \frac{1}{T_2}\right)\right\}$$

wherein $T_1$ is the reference temperature, and $T_2$ is the temperature of the at least a portion of the non-volatile memory array at the second time.

11. The solid-state storage device of claim 1, wherein the controller is configured to determine the data retention acceleration factor value by accessing a look-up table comprising data retention acceleration factor values.

12. The solid-state storage device of claim 1, wherein the predetermined threshold value is based at least in part on a program/erase cycling condition of the solid-state memory array.

13. A method of monitoring data retention a data storage system comprising a non-volatile solid-state memory array and a controller, the method comprising:
writing user data to a non-volatile solid-state memory array of a data storage system at a first time;
receiving a signal from a temperature sensor indicating a temperature of at least a portion of the non-volatile memory array at a second time;
determining a data retention acceleration factor value based at least in part on the temperature signal;
determining an accumulated effective data retention time period relative to a reference temperature;
determining whether the effective data retention time period exceeds a predetermined threshold value; and causing a data refreshing operation to be executed when it is determined that the predetermined threshold value was exceeded;

wherein the method is performed under the control of a controller of the data storage system.

14. The method of claim 13, further comprising, when it is determined that the predetermined threshold value was not exceeded:
receiving a next signal from the temperature sensor indicating a temperature of the at least a portion of the non-volatile memory array at a third time a predetermined period of time after the second time;
determining a next data retention acceleration factor value based at least in part on the next temperature signal;
determining an updated accumulated effective data retention time period relative to the reference temperature;
determining whether the updated effective data retention time period exceeds the predetermined threshold value; and
causing a data refreshing operation to be executed when it is determined that the predetermined threshold value was exceeded.

15. The method of claim 14, wherein the predetermined period of time is approximately one hour.

16. The method of claim 14, wherein the predetermined period of time is at least partially temperature dependent.

17. The method of claim 14, wherein the predetermined period of time is based at least in part on a program/erase cycling condition of the solid-state memory array.

18. The method of claim 14, wherein determining the updated accumulated effective data retention time period comprises multiplying the next data retention acceleration factor value by the predetermined period of time to produce a value and adding the value to the accumulated effective data retention time period to produce the updated accumulated effective data retention time period.

19. The method of claim 13, wherein the reference temperature is approximately 40° C.

20. The method of claim 13, further comprising storing a timestamp value associated with the first time.

21. The method of claim 13, further comprising storing the accumulated effective data retention time period for use in determining an updated accumulated effective data retention time period at a future time.

22. The method of claim 13, wherein determining the data retention acceleration factor is based at least in part on the following equation:

$$AF = \exp\left\{\frac{E_a}{K_B}\left(\frac{1}{T_1} - \frac{1}{T_2}\right)\right\}$$

wherein $T_1$ is the reference temperature, and $T_2$ is the temperature of the at least a portion of the non-volatile memory array at the second time.

23. The method of claim 13, wherein determining the data retention acceleration factor value comprises accessing a look-up table comprising data retention acceleration factor values.

24. The method of claim 13, wherein the predetermined threshold value is based at least in part on a program/erase cycling condition of the solid-state memory array.

* * * * *